(12) United States Patent
Lee

(10) Patent No.: US 12,164,800 B2
(45) Date of Patent: Dec. 10, 2024

(54) METHOD AND SYSTEM FOR DYNAMICALLY ADJUSTING STATE CHECK START TIME OF WORD LINES

(71) Applicant: SK hynix Inc., Gyeonggi-do (KR)

(72) Inventor: Seon Ju Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 8 days.

(21) Appl. No.: 17/684,661

(22) Filed: Mar. 2, 2022

(65) Prior Publication Data

US 2023/0108751 A1 Apr. 6, 2023

(30) Foreign Application Priority Data

Oct. 1, 2021 (KR) ........................ 10-2021-0130562

(51) Int. Cl.
*G06F 3/06* (2006.01)
(52) U.S. Cl.
CPC .......... *G06F 3/0656* (2013.01); *G06F 3/0604* (2013.01); *G06F 3/0679* (2013.01)
(58) Field of Classification Search
CPC ..... G06F 3/0656; G06F 3/0604; G06F 3/0679
USPC ........................................................ 711/154
See application file for complete search history.

(56) References Cited

U.S. PATENT DOCUMENTS

| | | | |
|---|---|---|---|
| 10,203,876 B2* | 2/2019 | Ogawa | G06F 3/0605 |
| 2011/0013690 A1* | 1/2011 | Kobayashi | H04L 25/4917 |
| | | | 375/240 |
| 2011/0197041 A1* | 8/2011 | Yamada | G06F 11/2064 |
| | | | 711/E12.103 |
| 2016/0239206 A1* | 8/2016 | Yun | G06F 3/0653 |
| 2018/0232157 A1* | 8/2018 | Seo | G06F 3/0688 |

FOREIGN PATENT DOCUMENTS

KR 10-2016-0100170 A 8/2016

* cited by examiner

*Primary Examiner* — Than Nguyen
(74) *Attorney, Agent, or Firm* — IP & T GROUP LLP

(57) ABSTRACT

A memory system may include: a memory device including at least one word line and at least one memory cell coupled to the word line, and a controller including a write buffer configured to store a program command and data received from a host, the controller suitable for controlling a program operation of storing the data in the word line based on the program command, setting state check time of the word line during a performance period of the program operation, and checking a state of the word line according to a timeout signal generated based on the set state check time.

21 Claims, 13 Drawing Sheets

METHOD AND SYSTEM FOR DYNAMICALLY ADJUSTING STATE CHECK START TIME OF WORD LINES

CROSS-REFERENCE TO RELATED APPLICATION(S)

The present application claims priority under 35 U.S.C. § 119(a) to Korean Patent Application No. 10-2021-0130562, filed on Oct. 1, 2021, the disclosure of which is incorporated herein by reference in its entirety.

BACKGROUND

1. Field

One or more embodiments described herein relate to a memory device and a method of operating a memory system including a memory device.

2. Description of the Related Art

The use of mobile phones, digital cameras, notebook computers, and other portable electronic devices continues to increase worldwide. These devices use or include a memory system that includes at least one memory (or other data storage) device.

Unlike a hard disk, a data storage device implemented by a nonvolatile semiconductor memory has excellent stability and durability because it has no mechanical driving parts (e.g., a mechanical arm). These devices also have high data access speeds and low power consumption. Examples of such data storage devices include a universal serial bus (USB) memory device, a memory card having various interfaces, and a solid state drive (SSD).

SUMMARY

Various embodiments of the present disclosure are directed to a memory system capable of dynamically adjusting state check start time of word lines of a memory device, and an operating method of the memory system.

Also, various embodiments of the present disclosure are directed to a memory system capable of adjusting state check start time of word lines of a memory device on the basis of a usage of a write buffer and maximum and minimum word line program time, and an operating method of the memory system.

Also, various embodiments of the present disclosure are directed to a memory system that prevents deterioration of quality of service (QoS) by keeping program response time constant even in performing a garbage collection state, and an operating method of the memory system.

In accordance with an embodiment of the present invention, a memory system may include: a memory device including at least one word line and at least one memory cell coupled to the word line; and a controller including a write buffer configured to store a program command and data received from a host, the controller suitable for controlling a program operation of storing the data in the word line based on the program command, setting state check time of the word line during a performance period of the program operation, and checking a state of the word line according to a timeout signal generated based on the set state check time.

In accordance with an embodiment of the present invention, a method of operating a memory system, may include: performing a program operation on at least one word line; setting state check time for the word line during a performance period of the program operation; generating a timeout signal based on the sate check time; and checking a state of the word line according to the timeout signal.

In accordance with an embodiment of the present invention, a memory system may include: a memory device including at least one memory cell coupled to at least one word line; and a controller configured to: perform a program operation on the memory cell; determine a state check time for the word line; generate a timeout signal based on the state check time; and transmit, to the memory device, a state check command in response to the timeout signal such that the memory device checks a busy or ready state of the word line associated with the program operation on the memory cell and notifies the controller of the state of the word line. The state check time may be determined based on a sum of a basic state check time and an additional state check time. The basic state check time may be determined based on the memory cell. The additional state check time may be determined based on a target program response time, a maximum program time and a minimum program time of the word line.

DETAILED DESCRIPTION

Figure 1:
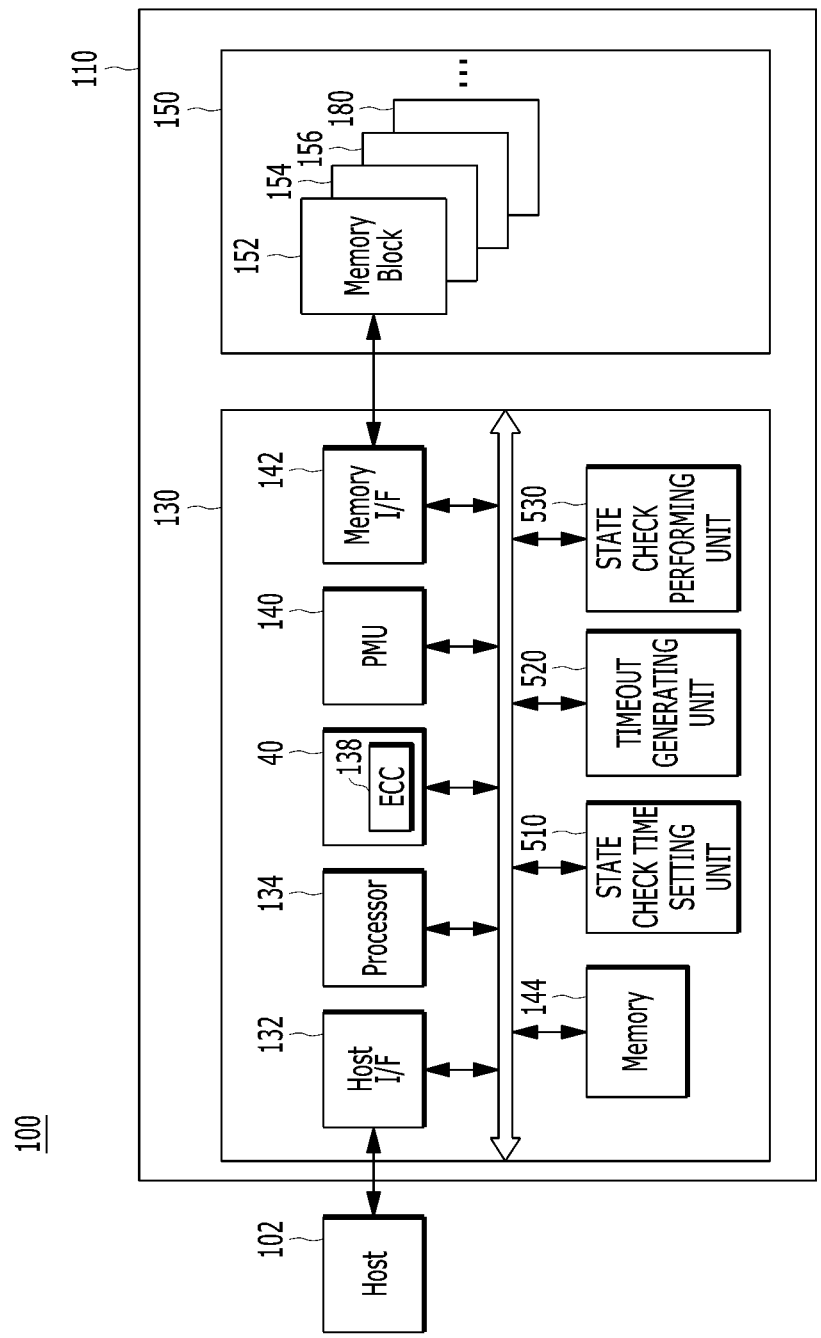
FIG. 1 illustrates an embodiment of a data processing system including a memory system.

Various embodiments of the present disclosure are described below with reference to the accompanying drawings. Elements and features of the disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware-for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in the disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor (s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 is a diagram schematically illustrating an embodiment of a data processing system 100 including a memory system.

Referring to FIG. 1, the data processing system 100 may include a host 102 engaged or operably coupled with the memory system 110.

The host 102 may include a mobile phone, an MP3 player, a laptop computer, or the like, and an electronic device, such as a desktop computer, a game player, a television (TV), a projector, or another type of portable electronic device.

The host 102 includes at least one operating system (OS) for managing and controlling functions and operations performed in the host 102. The OS can provide interoperability between the host 102 engaged with the memory system 110 and the user using the memory system 110. The OS may support functions and operations corresponding to user requests.

By way of example but not limitation, the OS can be classified into a general operating system and a mobile operating system according to mobility of the host 102. The general operating system may include a personal operating system and an enterprise operating system according, for example, to system requirements or a user environment. The personal operating system (e.g., Windows, Chrome, etc.) may be subject to support services for general purposes. In one embodiment, the enterprise operating system(s) can be specialized for securing and supporting high performance, including Windows servers, Linux, Unix, and the like.

The mobile operating system may include Android, iOS, Windows mobile, or another type of mobile operating system. The mobile operating system may be subject to support services or functions for mobility (e.g., a power saving function). The host 102 may include a plurality of operating systems and may execute multiple operating systems interlocked with the memory system 110, for example, corresponding to user requests. The host 102 may transmit a plurality of commands corresponding to the user requests to the memory system 110, thereby performing operations corresponding to commands within the memory system 110.

The storage devices for the memory system 110 may be implemented with a volatile memory device (e.g., a dynamic random access memory (DRAM), a static RAM (SRAM), etc.) and/or a nonvolatile memory device (e.g., read only memory (ROM), a mask ROM (MROM), programmable ROM (PROM), erasable programmable ROM (EPROM), electrically erasable programmable ROM (EEPROM), ferroelectric RAM (FRAM), phase-change RAM (PRAM), magneto-resistive RAM (MRAM), resistive RAM (RRAM or ReRAM), flash memory, etc.).

The memory system 110 may include a controller 130 and a memory device 150. The memory device 150 may store data to be accessed by the host 102. The controller 130 may control operations including storing data in the memory device 150.

The controller 130 and the memory device 150 in included the memory system 110 may be integrated into a single semiconductor device, which may be included in any of the various types of memory systems as discussed above in the examples.

By way of example but not limitation, the controller 130 and memory device 150 may be implemented with an SSD. When the memory system 110 is used as an SSD, the operating speed of the host 102 connected to the memory system 110 can be improved more than that of the host 102 implemented with a hard disk. In addition, the controller 130 and the memory device 150 may be integrated into one semiconductor device to form a memory card. Examples include a PC card (PCMCIA), a compact flash card (CF), a memory card such as a smart media card (SM, SMC), a memory stick, a multimedia card (MMC, RS-MMC, MMC-micro), a SD card (SD, miniSD, microSD, SDHC), a universal flash memory, or the like.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while electrical power is not supplied. The memory device 150 may store data provided by the host 102 through a write operation and provide data stored therein to the host 102 through a read operation. The memory device 150 may include a plurality of memory blocks BL0CK<0, 1, 2, . . . >, each of which may include a plurality of pages P<0, 1, 2, 3, 4, . . . >. Each of the pages P<0, 1, 2, 3, 4, . . . > may include a plurality of memory cells to which a corresponding one of a plurality of word lines (WL) is coupled. The memory device 150 also includes a plurality of memory dies 150A, 150B, 150C, and 150D as shown in FIG. 1, each of which includes a plurality of planes. Each of the planes includes some memory blocks among the memory blocks BL0CK<0, 1, 2, . . . >. In addition, the memory device 150 may be a flash memory, which, for example, may have a three-dimensional stack structure.

The controller 130 in the memory system 110 may control the memory device 150 in response to a request from the host 102. For example, the controller 130 may provide to the host 102 data read from the memory device 150, and may store data provided from the host 102 in the memory device 150. The controller 130 may control read, write, program, and erase operations of the memory device 150.

The controller 130 may include a host interface 132, a processor 134, error correction code (ECC) circuitry 138, a power management unit (PMU) 140, a memory interface 142, and a memory 144.

The host interface 132 may process commands and data provided by the host 102, and may communicate with the host 102 through at least one of various interface protocols. Examples include universal serial bus (USB), multimedia card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI), and integrated drive electronics (IDE). In accordance with an embodiment, the host interface 132 may exchange data with the host 102, which may be implemented through firmware such as a host interface layer (HIL).

The flash translation layer (hereinafter referred to as "FTL") unit 40 may control general operations of the memory system 110. For example, the FTL unit 40 may receive a read command, a program command and logical addresses of data corresponding to the read and program commands from the host interface unit 132, and may include a logical to physical (L2P) map to convert the received logical addresses of the data into physical addresses of the memory device 150. In one embodiment, the FTL unit 40 may be firmware driven by the processor 134.

The FTL unit 40 may convert the logical addresses of the data provided from the host interface unit 132 to the physical addresses of the memory device 150, which correspond to the logical addresses of the data. The FTL unit 40 may perform this operation using the L2P map, and may transmit physical addresses of the data to the memory interface unit 142.

The FTL unit 40 may include an ECC unit 138 which corrects error bits of the data to be processed in (e.g., output from) the memory device 150. In one embodiment, the ECC unit 138 may include an ECC encoder and an ECC decoder. The ECC encoder can perform error correction encoding of data to be programmed in the memory device 150 to generate encoded data to which a parity bit is added. The ECC encoder can then store the encoded data in memory device 150. The ECC decoder can detect and correct errors contained in a data read from the memory device 150 when the controller 130 reads the data stored in the memory device 150. For example, after performing error correction decoding on the data read from the memory device 150, the ECC component 138 can determine whether the error correction decoding has succeeded and can output an instruction signal (e.g., a correction success signal or a correction fail signal). The ECC component 138 can use the parity bit (generated during the ECC encoding process) for correcting the error bit of the read data. When the number of the error bits is greater than or equal to a threshold number of correctable error bits, the ECC component 138 might not correct error bits but instead may output an error correction fail signal indicating failure in correcting the error bits.

The ECC component 138 may perform an error correction operation based on a coded modulation, such as modulation performed based on a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC component 138 may include any and all circuits, modules, systems or devices for performing the error correction operation based on at least one of the above described codes.

The PMU 140 may manage electrical power provided in the controller 130.

The memory interface 142 may serve as an interface for handling commands and data transferred between the controller 130 and the memory device 150, to allow the controller 130 to control the memory device 150 in response to a request delivered from the host 102. The memory interface 142 may generate control signals for the memory device 150 and may process data entered into or output from the memory device 150 under the control of the processor 134 when the memory device 150 is a flash memory and, in particular, when the memory device 150 is a NAND flash memory. The memory interface 142 can provide an interface for handling commands and data between the controller 130 and the memory device 150, for example, operations of NAND flash interface, and in particular, operations between the controller 130 and the memory device 150. In accordance with an embodiment, the memory interface 142 can be implemented through firmware called a Flash Interface Layer (FIL) as a component for exchanging data with the memory device 150.

The memory 144 may support operations performed by the memory system 110 and the controller 130. The memory 144 may store temporary or transactional data which occurred or was delivered for operations in the memory system 110 and the controller 130. The controller 130 may control the memory device 150 in response to a request from the host 102. The controller 130 may deliver data read from the memory device 150 into the host 102. The controller 130 may store data entered through the host 102 within the memory device 150. The memory 144 may be used to store data for the controller 130 and the memory device 150 in order to perform operations such as read operations or program/write operations or erase operation.

When the controller 130 controls read, write, program, and erase operations of the memory device 150, data to be transferred or generated between the controller 130 and the memory device 150 in the memory system 110 may be stored in the memory 144. For example, the memory 144 may store data to perform data write and read operations between the host 102 and the memory device 150 and data when performing the data write and read operations. For such data storage, the memory 144 may include a program memory, a data memory, a write buffer/cache, a read buffer/cache, a data buffer/cache, a map buffer/cache, and so forth.

The memory 144 may be or include a volatile memory. For example, the memory 144 may be or include a static random access memory (SRAM) or a dynamic random access memory (DRAM). The memory 144 may exist inside the controller 130 as illustrated in the drawing. In one embodiment, the memory 144 may exist outside the controller 130. In this case, the memory 144 may be or include an external volatile memory to and from which data is input to and output from the controller 130 through a separate memory interface.

The processor 134 controls the entire operations of the memory system 110. For example, the processor 134 controls a program operation or a read operation for the memory device 150, in response to a write request or a read request from the host 102. The processor 134 drives firmware (e.g., a flash translation layer (FTL)) to control general operations of the memory system 110. The processor 134 may be realized by a microprocessor or a central processing unit (CPU).

For instance, the controller 130 performs an operation in the memory device 150 as requested from the host 102. In one embodiment, the controller 130 performs a command operation (corresponding to a command received from the host 102) with the memory device 150 through the processor 134 embodied by a microprocessor or a central processing unit (CPU). The controller 130 may perform a foreground operation such as a command operation corresponding to a command received from the host 102. In one embodiment, the controller 130 may perform a program operation corresponding to a write command, a read operation corresponding to a read command, an erase operation corresponding to an erase command, or a parameter set operation corresponding to a set parameter command or a set feature command as a set command.

The controller 130 may also perform a background operation for the memory device 150, through the processor 134 embodied by a microprocessor or a central processing unit (CPU). The background operation for the memory device 150 may include copying data stored in a memory block among the memory blocks 152, 154 and 156 of the memory device 150 to another memory block, for example, a garbage collection (GC) operation. The background operation may swap data between one or more of the memory blocks 152, 154 and 156 of the memory device 150, for example, a wear leveling (WL) operation and a read reclaim (RR) operation. The background operation may store map data retrieved from the controller 130 in the memory blocks 152, 154 and 156 of the memory device 150, for example, a map flush operation. The background operation may include a bad management operation for the memory device 150, which may include checking for and processing a bad block among the plurality of memory blocks 152, 154 and 156 in the memory device 150.

The controller 130 performs a plurality of command operations corresponding to a plurality of commands from the host 102. For example, when performing a plurality of read operations corresponding to plural read commands and a plurality of erase operations corresponding to plural erase commands sequentially, randomly or alternatively, the controller 130 may determine which channel or way in a plurality of channels (or ways), for connecting the controller 130 to a plurality of memory dies in the memory 150, is proper or appropriate for performing each operation. The controller 130 may transmit data or instructions via determined channels or ways for performing each operation. The memory dies in the memory 150 may transmit an operation result via the same channels or ways, respectively, after each operation is complete. Then, the controller 130 may transmit a response or an acknowledge signal to the host 102. In an embodiment, the controller 130 may check a status of each channel or each way. In response to a command from the host 102, the controller 130 may select at least one channel or way based on the status of each channel or each way so that instructions and/or operation results with data may be delivered via the selected channel(s) or way(s).

By way of example but not limitation, the controller 130 may recognize statuses regarding a plurality of channels (or ways) associated with a plurality of memory dies in the memory device 150. For example, the controller 130 may determine each channel or each way as one of a busy state, a ready state, an active state, an idle state, a normal state, and/or an abnormal state. The determination of the controller 130 may be associated with a physical block address. The controller 130 may refer to descriptors from the memory device 150. The descriptors may include, for example, parameters that describe one or more characteristics of the memory device 150. In one embodiment, the descriptors may be data with a set format or structure. For instance, the descriptors may include device descriptors, configuration descriptors, and/or unit descriptors. The controller 130 may refer to, or use, the descriptors to determine which channel(s) or way(s) an instruction or data is exchanged via.

The state check time setting unit 510 may set time for performing a state check after the memory device 150 starts programming for a word line. For example, the state check time may indicate a time for the controller 130 to start performing the state check after the programming starts. In one embodiment, when program performance time for any one word line of the memory device 150 is a predetermined time (e.g., 1,500 us), the state check time setting unit 510 may set the state check time to 1,500 us so that the state check is performed on the word line after 1,500 us. In this case, the state check time setting unit 510 may check whether a program command has been transmitted to the memory device 150, set the state check time, and may not set the state check time when the program command has not been transmitted to the memory device 150.

The timeout generating unit 520 may generate a timeout signal when the state check time set by the state check time setting unit 510 has elapsed, and transmit the generated timeout signal to the state check performing unit 530. For example, when the state check time set by the state check time setting unit 510 is the predetermined time (e.g., 1,500 us), the timeout generating unit 520 may generate the timeout signal after 1,500 us has lapsed, and transmit the generated timeout signal to the state check performing unit 530. The predetermined time may be different from 1,500 us in another embodiment.

The state check performing unit 530 may check the state of a word line on which the programming has been performed, on the basis of the timeout signal received from the timeout generating unit 520. Examples of the state of the word line may include a ready state in which other commands are executable and a busy state in which other commands are not executable.

For example, when the state check performing unit 530 receives the timeout signal and checks the state of a word line while the memory device 150 is still performing the programming on the word line, the state check performing unit 530 may receive a signal from the memory device 150 indicating that the word line is in the busy state. When the memory device 150 completely performs the programming on the word line, the state of the word line may be changed from the busy state to the ready state, and the state check performing unit 530 may receive a signal from the memory device 150 indicating that the word line is in the ready state.

The state check performing unit 530 may perform the state check on a word line on which the programming is being performed or has been performed, at a specific time interval or a specific number of times. The state check performing unit 530 may change the specific time interval or the specific number of times depending on characteristics or types of the word line.

The state check time setting unit 510, the timeout generating unit 520 and the state check performing unit 530 may be hardware modules or software modules executed by the processor 134.

Embodiments of the memory device of the memory system are described in detail with reference to FIGS. 2 to 4.

Figure 2:
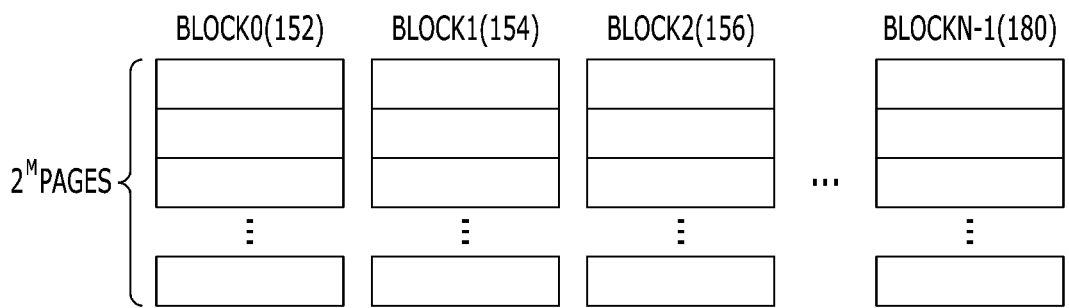
FIG. 2 illustrates an embodiment of a memory device.

FIG. 2 is a diagram schematically illustrating an embodiment of a memory device. FIG. 3 is a diagram schematically illustrating an embodiment of a cell array circuit of memory blocks in the memory device. FIG. 4 is a diagram schematically illustrating an embodiment of a memory device structure in the memory system.

Referring to FIG. 2, the memory device 150 may include a plurality of memory blocks BL0CK0 to BL0CKN-1, where N is an integer greater than 1. Each of the blocks BL0CK0 to BL0CKN-1 may include a plurality of pages, for example, 2M or M pages, the number of which may vary according to circuit design, and with M being an integer greater than 1. Each of the pages may include a plurality of memory cells that are coupled to a plurality of word lines WL.

Memory cells in the respective memory blocks BL0CK0 to BL0CKN-1 may be one or more of a single level cell (SLC) storing 1-bit data or a multi-level cell (MLC) storing 2-bit data. Hence, the memory device 150 may include memory blocks including SLCs (e.g., SLC memory blocks) or memory blocks including MLCs (e.g., MLC is memory blocks) depending on the number of bits which can be expressed or stored in each of the memory cells in the memory blocks. The SLC memory blocks may include a plurality of pages which are embodied by memory cells, each of which stores one-bit data. The SLC memory blocks may generally have higher data computing performance and higher durability than the MLC memory blocks. The MLC memory blocks may include a plurality of pages which are embodied by memory cells each storing multi-bit data (for example, 2 or more bits). The MLC memory blocks may generally have larger data storage space (e.g., higher integration density) than the SLC memory blocks.

In another embodiment, the memory device 150 may include a plurality of triple level cell (TLC) memory blocks. The TLC memory blocks may include a plurality of pages which are embodied by memory cells each capable of storing 3-bit data. In another embodiment, the memory device 150 may include a plurality of quadruple level cell (QLC) memory blocks. The QLC memory blocks may include a plurality of pages which are embodied by memory cells each capable of storing 4-bit data.

Instead of a nonvolatile memory, the memory device 150 may be implemented by any of a phase change random access memory (PCRAM), a resistive random access memory (RRAM or ReRAM), a ferroelectrics random access memory (FRAM), or a spin transfer torque magnetic random access memory (SU-RAM or STT-MRAM).

The memory blocks 152, 154, 156, 180 may store the data transferred from the host 102 through a program operation, and may transfer data stored therein to the host 102 through a read operation.

Figure 3:
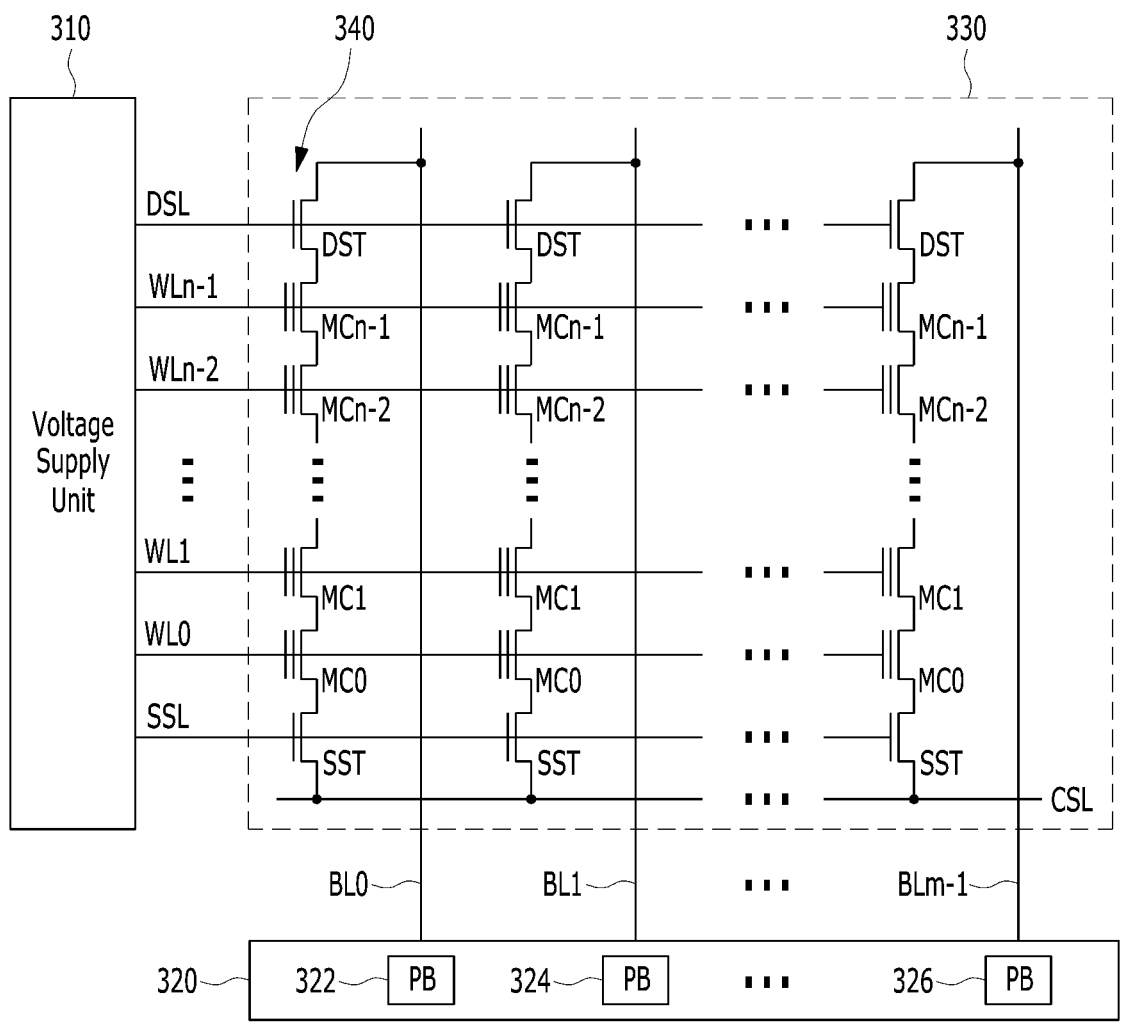
FIG. 3 illustrates an embodiment of a cell array circuit.
Figure 4:
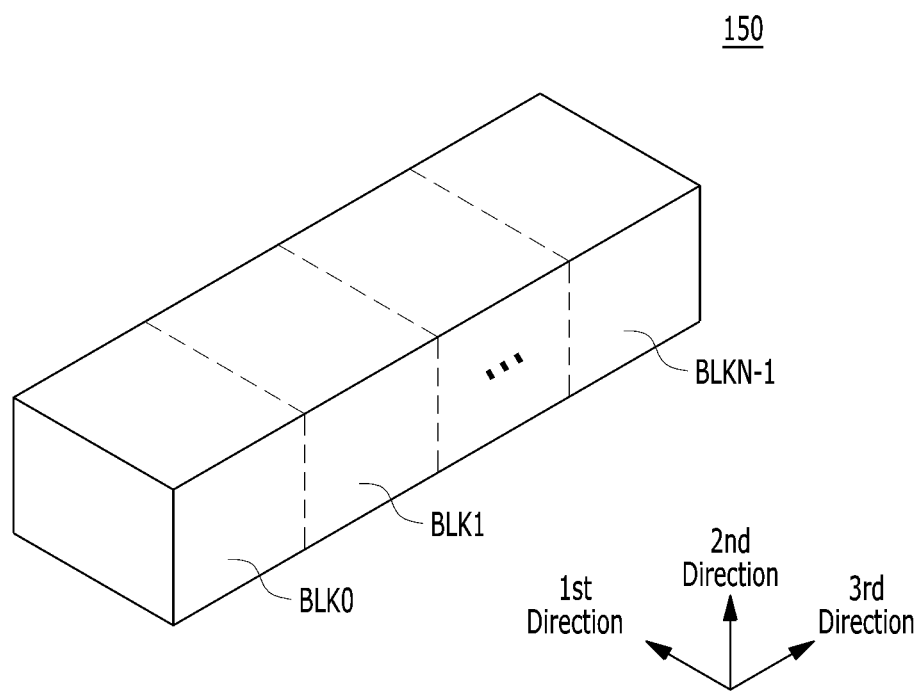
FIG. 4 illustrates an embodiment of a memory device structure.

Referring to FIG. 3, a memory block 330, which is representative of any of the memory blocks of the memory device 150, may include a plurality of cell strings 340 coupled to a plurality of corresponding bit lines BL0 to BLm-1. The cell string 340 of each column may include one or more drain select transistors DST and one or more source select transistors SST. A plurality of memory cells MC0 to MCn-1 may be coupled in series between the drain and source select transistors DST and SST. In an embodiment, each of the memory cell transistors MC0 to MCn-1 may be embodied by an MLC capable of storing data information of a plurality of bits. Each of the cell strings 340 may be electrically coupled to a corresponding bit line among the bit lines BL0 to BLm-1. For example, as illustrated in FIG. 3, the first cell string is coupled to the first bit line BL0, and the last cell string is coupled to the last bit line BLm-1.

Although FIG. 3 illustrates NAND flash memory cells, the present invention is not limited thereto. It is noted that the memory cells may be NOR flash memory cells, or hybrid flash memory cells including two or more kinds of memory cells combined therein. In one embodiment, the memory device 150 may be a flash memory device including a conductive floating gate as a charge storage layer or a charge trap flash (CTF) memory device including an insulation layer as a charge storage layer.

The memory device 150 may further include a voltage supply 310 which generates different word line voltages including, for example, a program voltage, a read voltage, and a pass voltage to supply to the word lines according to an operation mode. The voltage generation operation of the voltage supply 310 may be controlled by a control circuit. Under the control of the control circuit, the voltage supply 310 may select at least one of the memory blocks (or sectors) of the memory cell array, select at least one of the word lines of the selected memory block, and provide the word line voltages to the selected word line(s) and the unselected word lines as may be needed.

The memory device 150 may include a read/write circuit 320 which is controlled by the control circuit. During a verification/normal read operation, the read/write circuit 320 may operate as a sense amplifier for reading (sensing and amplifying) data from the memory cell array. During a program operation, the read/write circuit 320 may operate as a write driver for supplying a voltage or a current to bit lines according to data to be stored in the memory cell array. During a program operation, the read/write circuit 320 may receive data to be stored into the memory cell array from a buffer and drive bit lines according to the received data. The read/write circuit 320 may include a plurality of page buffers 322 to 326 respectively corresponding to columns (or bit lines) or column pairs (or bit line pairs). Each of the page buffers 322 to 326 may include a plurality of latches.

The memory device 150 may be embodied by a two-dimensional (2D) or three-dimensional (3D) memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN-1. In FIG. 4, a block diagram illustrates the memory blocks 152, 154 and 156 of the memory device 150 shown in FIG. 1. Each of the memory blocks 152, 154 and 156 may be realized in a 3D structure (or vertical structure). For example, each of the memory blocks 152, 154 and 156 may be a 3D structure with dimensions extending in first to third directions, e.g., an x-axis direction, a y-axis direction, and a z-axis direction.

Each memory block 330 in the memory device 150 may include a plurality of NAND strings NS that extend in the second direction. A plurality of NAND strings NS extend in the first direction and the third direction. In one embodiment, each of the NAND strings NS may be coupled to a bit line BL, at least one string select line SSL, at least one ground select line GSL, a plurality of word lines WL, at least one dummy word line DWL, and a common source line CSL. Each of the NAND strings NS may include, for example, a plurality of transistor structures TS.

Thus, among the memory blocks 152, 154 and 156 of the memory device 150, each memory block 330 may be coupled to a plurality of bit lines BL, a plurality of string select lines SSL, a plurality of ground select lines GSL, a plurality of word lines WL, a plurality of dummy word lines DWL, and a plurality of common source lines CSL, and each memory block 330 may include a plurality of NAND strings NS. In each memory block 330, one bit line BL may be coupled to a plurality of NAND strings NS to realize a plurality of transistors in one NAND string NS. A string select transistor SST of each NAND string NS may be coupled to a corresponding bit line BL, and a ground select transistor GST of each NAND string NS may be coupled to a common source line CSL. Memory cells MC may be provided between the string select transistor SST and the ground select transistor GST of each NAND string NS. For example, a plurality of memory cells may be realized in each memory block 330 of the memory blocks 152, 154 and 156 of the memory device 150.

Figure 5:
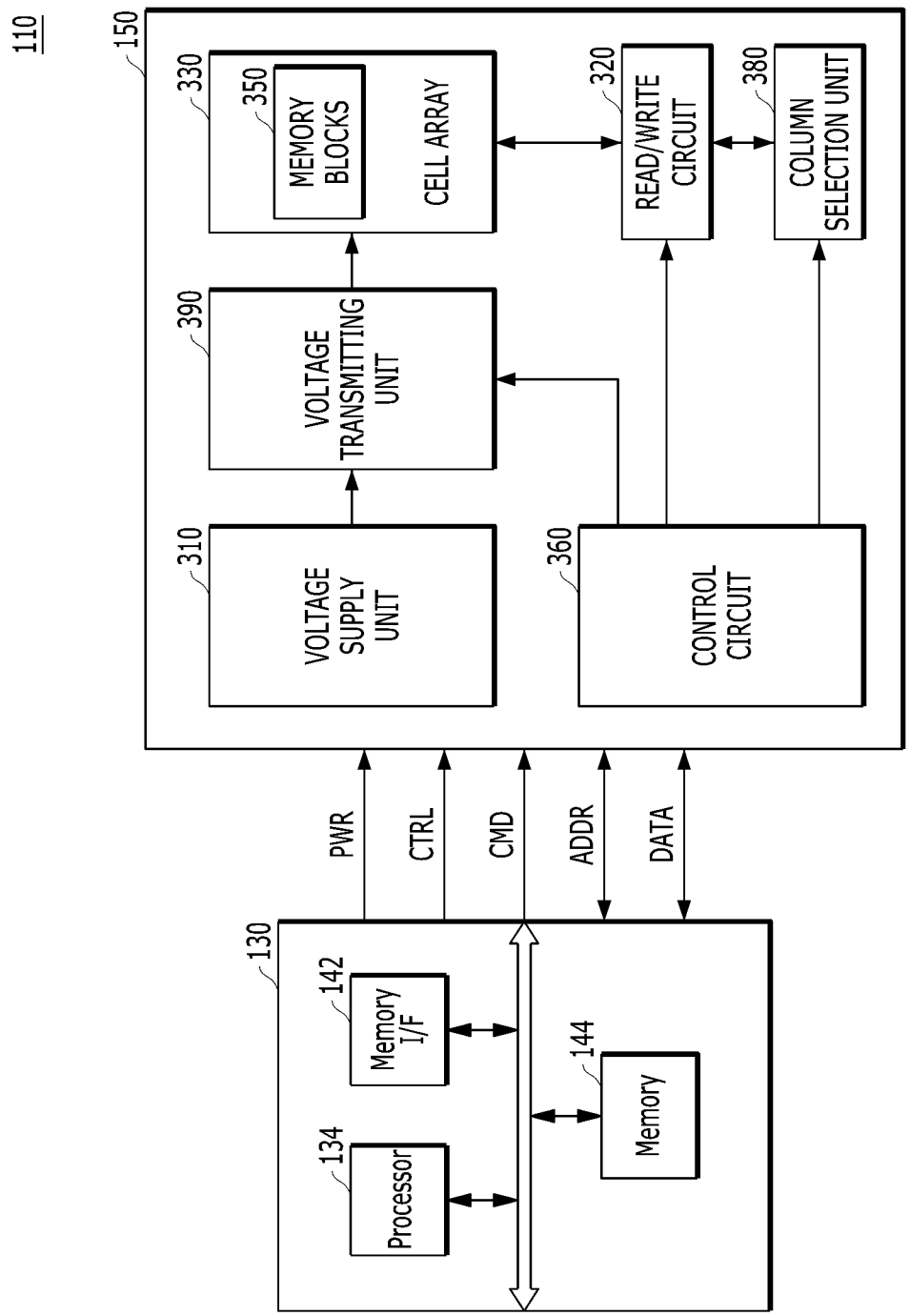
FIG. 5 illustrates a proposed memory system.

FIG. 5 is a diagram illustrating a memory system which may include some of the reference numerals mentioned above.

Referring to FIG. 5, the memory device 150 may perform erase, write and read operations under the control of the controller 130. The memory device 150 may receive a command CMD, an address ADDR and data DATA from the controller 130 through an input/output line. The command CMD may include a read command for performing the read operation, a write command for performing a program operation and a state check command for performing a state check operation on a word line.

In addition, the memory device 150 may receive power PWR from the controller 130 through a power line, and receive a control signal CTRL from the controller 130 through a control line. The control signal CTRL may include a data strobe signal DQS, a command latch enable signal CLE, an address latch enable signal ALE, a chip enable signal CE, a write enable signal WE and a read enable signal RE.

The memory device 150 may include a cell array 330, a control circuit 360, a voltage supply unit 310, a voltage transmitting unit 390, a read/write circuit 320 and a column selection unit 380.

The cell array 330 may include a plurality of memory blocks 350. User data may be stored in the memory blocks 350.

The control circuit 360 may control general operations related to the program, erase and read operations of the memory device 150.

The voltage supply circuit 310 may generate word line voltages, for example, a program voltage, a read voltage and a pass voltage, to be supplied to respective word lines according to an operation mode, and voltages to be supplied to bulks, for example, well regions in which memory cells are formed. A voltage generating operation of the voltage supply circuit 310 may be performed under the control of the control circuit 360.

The voltage supply circuit 310 may generate a plurality of variable read or program voltages to read data from or program data into the memory block 350.

The voltage transmitting unit 390 may select one of the memory blocks or sectors of the cell array 330 in response to the control of the control circuit 360, and select one of the word lines of the selected memory block. The voltage transmitting unit 390 may provide the word line voltages generated by the voltage supply circuit 310 to the selected word line and unselected word lines, respectively, in response to the control of the control circuit 360.

The read/write circuit 320 may be controlled by the control circuit 360, and operate as a sense amplifier or a write driver according to an operation mode. For example, in the case of verification and normal read operations, the read/write circuit 320 may operate as a sense amplifier for reading data from the cell array 330. During the normal read operation, the column selection unit 380 may output data read from the read/write circuit 320 to an external device, for example, the controller 130, in response to column address information. Unlike such a configuration, during the verification read operation, the read data may be provided to a pass/fail verification circuit included in the memory device 150, and be used to determine whether the memory cells have been successfully programmed.

In the case of the program operation, the read/write circuit 320 may operate as a write driver for driving bit lines according to data to be stored in the cell array 330. During the program operation, the read/write circuit 320 may receive the data to be written to the cell array 330 from a buffer of the controller 130, and drive the bit lines according to the inputted data.

To this end, the read/write circuit 320 may include a plurality of page buffers respectively corresponding to columns (or bit lines) or column pairs (or bit line pairs). A plurality of latches may be included in each of the page buffers. Each of the page buffers may include a most significant bit (MSB) page buffer, a central significant bit (CSB) page buffer and a least significant bit (LSB) page buffer.

In the case of the state check operation, the read/write circuit 320 may check whether the program operation has been completely performed on a word line. The read/write circuit 320 may notify the control circuit 360 that the word line is in a busy state when the program operation is being performed on the word line, and notify the control circuit 360 that the word line is in a ready state when the program operation has been completely performed on the word line, and the control circuit 360 may notify the controller 130 of the state of the word line.

Figure 6:
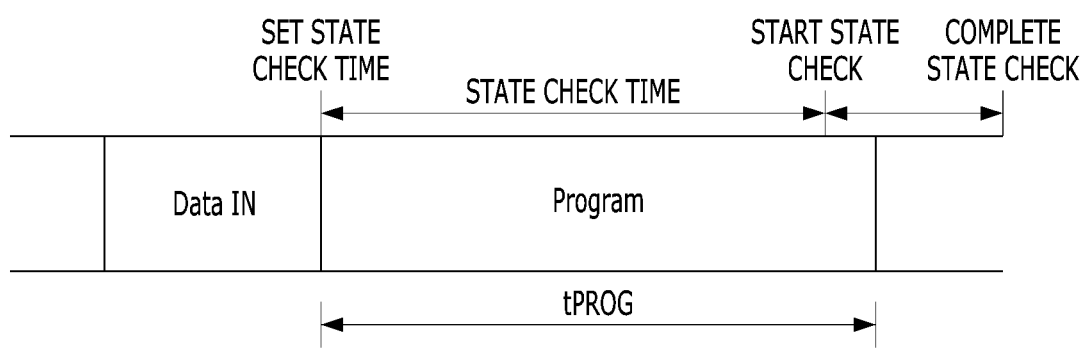
FIG. 6 illustrates an embodiment of a state check operation.

FIG. 6 is a diagram illustrating an embodiment of the state check operation, where programming is performed on a word line. Referring to FIG. 6, the controller 130 may transmit data to be programmed to the memory device 150, and the read/write circuit 320 may receive the data to be programmed, during a period Data IN in which data is inputted.

Subsequently, the read/write circuit 320 may apply a program voltage to the word line and perform the programming during a program performance period Program. The programming is performed during program performance time tPROG. The controller 130 may transmit a program command to the memory device 150, and set state check time. The state check time may be counted from when the programming starts, and elapse before the programming terminates. When the state check time elapses, the controller 130 may transmit a state check command to the memory device 150 to check the busy/ready states of the word line, and the control circuit 360 may check the state of the word line according to the received state check command, and may transmit the check result of the state of the word line to the controller 130.

When the programming for the word line does not terminate, the memory device 150 may notify the controller 130 that the word line is in the busy state. In this case, the controller 130 may continue to perform the state check operation at a predetermined period or a predetermined number of times until the programming for the word line terminates, the state of the word line becomes the ready state and the state check is completely performed.

Since the state check is set based on the program performance time tPROG for a word line, the program response time (e.g., the time for the host 102 to transmit a command to the controller 130 and then receive a response to the command from the controller 130) may be proportional to the time until the state of the word line is changed to the ready state, after the programming is completely performed on the word line and the state of the word line is notified to the controller 130. This time may vary depending on characteristics of the word line.

The program response time that varies depending on the word line may affect quality of service (QoS). In a state in which a garbage collection operation is performed due to insufficient free blocks in the memory device 150, constant response time (e.g., constant program response time) to a command may be a more important factor in the quality of service in some cases than the number of command processing operations per second. Also, inconstant program response time may degrade the quality of service.

Figure 7:
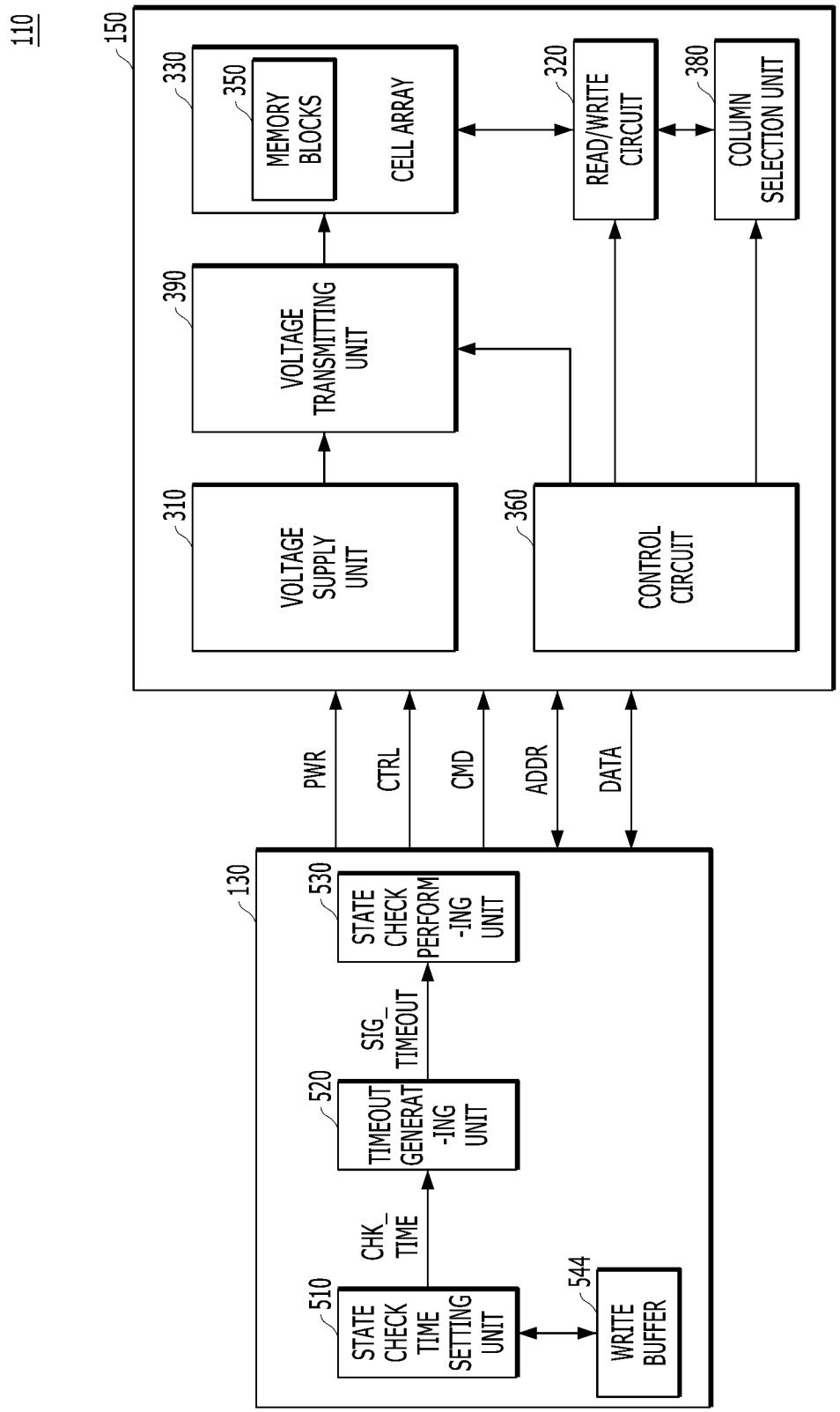
FIG. 7 illustrates an embodiment of a memory system.

FIG. 7 is a block diagram illustrating an embodiment of a memory system 110 which includes memory device 150 that may be substantially the same as that of FIG. 5.

Referring to FIG. 7, the controller 130 may include a state check time setting unit 510, a timeout generating unit 520, a state check performing unit 530 and a write buffer 544.

The state check time setting unit 510 may calculate time to perform a state check on a word line after the memory device 150 starts programming the word line, e.g., time to perform a check for determining whether the word line is in a ready state because the programming has been completely performed on the word line or in a busy state because the programming is currently being performed on the word line. Additionally, the state check time setting unit 510 may transmit state check time to the timeout generating unit 520, so that the timeout generating unit 520 sets the state check time.

The state check time setting unit 510 may calculate the state check time CHK_TIME on the basis of basic state check time. In an embodiment, the basic state check time may be the time set for each block, plane or die.

In addition, the state check time setting unit 510 may calculate the state check time on the basis of additional state check time. In an embodiment, the additional state check time may be calculated based on target program response time of the memory system 110, basic state check time, program time of each word line, or a usage rate of the write buffer 544.

In the present embodiment, the state check time may be calculated as the sum of the basic state check time and the additional state check time. The additional state check time may refer to time delayed after the basic state check time. For example, the timeout generating unit 520 may generate a timeout signal SIG_TIMEOUT after the basic state check time elapses and the additional state check time further elapses. The timeout generating unit 520 may then transmit the generated timeout signal to the state check performing unit 530. The state check performing unit 530 that received the timeout signal may perform the state check on a word line or a block. For example, the additional state check time may correspond to a time for delaying the state check by the additional state check time after the basic state check time lapses.

The additional state check time may be calculated for each word line or each block, and the state check performing unit 530 may perform the state check on the word line after the basic state check time elapses and the additional state check time further elapses. In this case, the program response time may be kept constant compared to the case where the state check performing unit 530 performs the state check after only the basic state check time elapses, which makes it possible to improve the quality of service (QoS).

The controller 130 may use part or all of the memory 144 as the write buffer 544 for storing data before programming the data into the memory device 150.

The state check time setting unit 510 may calculate the additional state check time on the basis of a difference between a maximum word line program time and a minimum word line program time.

Accordingly, the state check time setting unit 510 may calculate the maximum word line program time and the minimum word line program time for each block, plane or die.

In addition, the state check time setting unit 510 may check the usage rate of the write buffer 544 and may calculate the additional state check time in inverse proportion to the usage rate of the write buffer 544. The usage rate of the write buffer 544 may be represented based on a ratio of current usage of the write buffer 544 to target usage of the write buffer 544. As the usage rate of the write buffer 544 decreases, the additional state check time may increase.

When the state check time is calculated, the state check time setting unit 510 may transmit calculated time CHK_TIME to the timeout generating unit 520. The timeout generating unit 520 may be set to generate a timeout signal after the state check time elapses from the same time that the memory device 150 starts programming. The timeout generating unit 520 may then transmit a timeout signal SIG_TIMEOUT to the state check performing unit 530.

When receiving the timeout signal SIG_TIMEOUT from the timeout generating unit 520, the state check performing unit 530 may check whether the programming has been completely performed on the word line. In an embodiment, the state check performing unit 530 may control the memory interface 142 so that the memory interface 142 transmits a state check command and the memory device 150 executes the state check command to notify the state of the word line associated with the programming.

The state check performing unit 530 may perform the state check before the programming is completely performed on a word line. When the programming has been completely performed on the word line and the word line is in a ready state, the state check performing unit 530 may notify the processor 134 that the state check has been completely performed on the word line and the word line is in the ready state. When the programming has not been completely performed on the word line, the state check performing unit 530 may continuously perform the state check at a predetermined period or a predetermined number of times.

Figure 8:
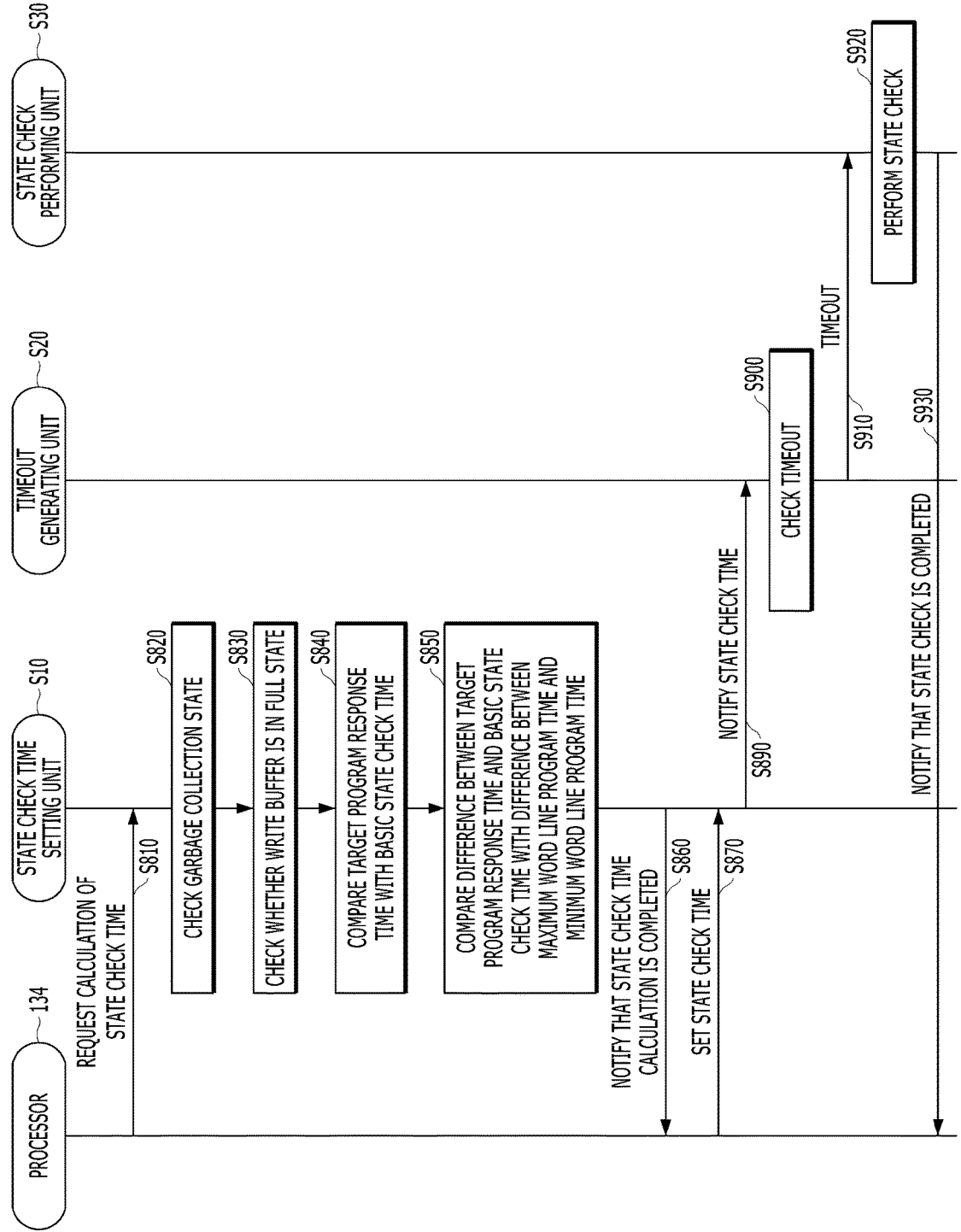
FIG. 8 illustrates an embodiment of a state check time setting process.

FIG. 8 is a flowchart illustrating an embodiment of a state check time setting process. Referring to FIGS. 7 and 8, at S810, the processor 134 may request the state check time setting unit 510 to calculate the state check time.

At S820, the state check time setting unit 510 may check whether the memory system 110 is in performing a garbage collection operation. In a state in which a garbage collection operation is being performed, in some cases the quality of service (QoS) may be more affected by whether the program response time is constant than the number of program command processing operations per second.

Therefore, even though the program response time increases, it may be considered as a more important factor in these cases to keep the program response time constant.

The program performance time may vary depending on word lines, and accordingly, the program response time may also vary.

When there is a large deviation in the program response time, the quality of service (QoS) may be evaluated as being relatively low. Therefore, keeping the program response time constant may be performed to maintain the quality of service (QoS).

Since there are a sufficient number of free blocks to be programmed when the memory system 110 is not performing the garbage collection state, the program response time is not affected. Therefore, the controller 130 may stop setting the state check time.

At S830, the state check time setting unit 510 may check whether the write buffer 544 is full or otherwise at a predetermined capacity. The controller 130 may use part or all of the memory 144 as the write buffer 544 for storing data before programming the data to the memory device 150. When the write buffer 544 is full (or at the predetermined capacity), the data of the write buffer 544 may be processed quickly and thus the program response time may be reduced or minimized. In this case, the state check time setting unit 510 may not set the state check time.

At S840, the state check time setting unit 510 may compare the target program response time with the basic state check time.

The target program response time may correspond to a target time required until the memory system 110 receives a command from the host 102, performs the programming, and transmits the completion of the programming to the host 102. The basic state check time may correspond, for example, to predetermined state check time.

When the target program time is greater than the basic state check time, this indicates that an additional state check time is required for the target program time. Therefore, the state check time setting unit 510 may continue to set the state check time. When the target program time is equal to or less than the basic state check time, this indicates that an additional state check time is not required. Therefore, the state check time setting unit 510 may stop setting the state check time. In this case, the state check time may be set as the basic state check time or may be set based on the program time of each word line.

At S850, the state check time setting unit 510 may compare a difference between the target program response time and the basic state check time with a difference between the maximum word line program time and the minimum word line program time. In the present embodiment, the state check time setting unit 510 may calculate the state check time based on the difference between the target program response time and the basic state check time, when the difference between the target program response time and the basic state check time is equal to or greater than the difference between the maximum word line program time and the minimum word line program time. The state check time setting unit 510 may calculate the state check time based on the difference between the maximum word line program time and the minimum word line program time, when the difference between the target program response time and the basic state check time is less than the difference between the maximum word line program time and the minimum word line program time.

For example, the state check time setting unit 510 may calculate the state check time based on the greater of the difference between the target program response time and the basic state check time and the difference between the maximum word line program time and the minimum word line program.

At S860, the state check time setting unit 510 may notify the processor 134 that the state check time calculation is completed.

At S870, the processor 134 may request the state check time setting unit 510 to set the state check time. At the same time, the processor 134 may transmit a program command to the memory device 150 through the memory interface 142.

At S890, the state check time setting unit 510 (which has been requested to set the state check time from the processor 134) may transmit the calculated state check time to the timeout generating unit 520.

At the moment when the processor 134 transmits the program command to the memory device 150 and the memory device 150 executes the program command, the timeout time equal to the state check time may be set.

At S900, the timeout generating unit 520 may check whether time for generating a timeout has elapsed. When it is time to generate the timeout, then, at S910, the timeout generating unit 520 may transmit a timeout signal to the state check performing unit 530.

At S920, the state check performing unit 530 may check the state of the word line of the memory device 150 on which the programming is being performed or has been completely performed. When a result of the state check indicates that the word line is in the busy state, the state check performing unit 530 may continuously perform the state check at a predetermined period or a predetermined number of times.

When the result of the state check indicates that the word line is in the ready state, then, at S930, the state check performing unit 530 may notify the processor 134 that the word line is in the ready state and the state check has been completely performed.

Figure 9:
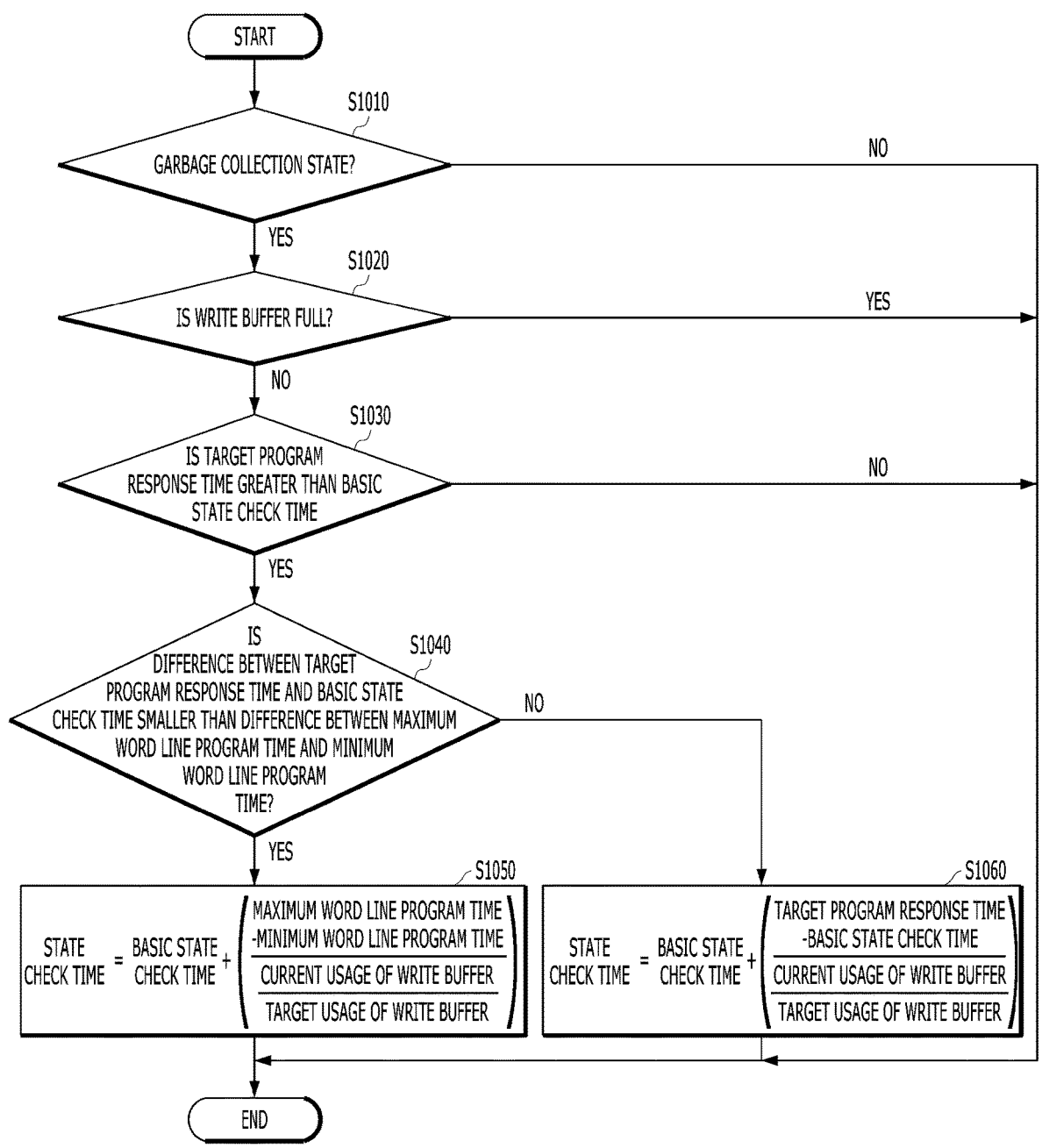
FIG. 9 illustrates an embodiment of a state check time setting process.

FIG. 9 is a flowchart illustrating an embodiment of a state check time setting process.

Referring to FIG. 9, at S1010, the controller 130 may check whether the memory system 110 is currently in performing a garbage collection state.

When the memory system 110 is currently in performing the garbage collection state (that is, "YES" at S1010), then, at S1020, the controller 130 may check whether the write buffer 544 is full (or at a predetermined capacity). When the memory system 110 is not currently in performing the garbage collection operation (that is, "NO" at S1010), the controller 130 may terminate setting the state check time.

When the memory system 110 is currently in performing the garbage collection operation, in some cases the quality of service (QoS) may be more affected by whether the program response time is constant than the number of program command processing operations per second. Therefore, even though the program response time increases, it may be preferrable in some cases considered to keep the program response time constant.

Since there are a sufficient number of free blocks to be programmed when the memory system is not currently in performing the garbage collection operation, the program response time is not affected. Accordingly, the controller 130 may stop setting the state check time.

When the write buffer 544 is not full (that is, "NO" at S1020), then, at S1030, the controller 130 may compare the target program response time with the basic state check time.

The state check time may be, for example, the sum of the basic state check time and the additional state check time. The additional state check time may be determined based on the maximum word line program time, the minimum word line program time and the usage of the write buffer.

The maximum word line program time or the minimum word line program time may be the word line program time calculated from one block, one plane or one die.

In the present embodiment, the maximum word line program time or the minimum word line program time may correspond to the word line program time calculated from one block.

The additional state check time may be inversely proportional to the usage rate of the write buffer. For example, as the usage rate of the write buffer decreases, the additional state check time may further increase so that the usage rate of the write buffer increases.

When the program response time is greater than the basic state check time (that is, "YES" at S1030), then at S1040, the controller 130 may check whether the difference between the target program response time and the basic state check time is less than the difference between the maximum word line program time and the minimum word line program time.

When the difference between the program response time and the basic state check time is less than the difference between the maximum word line program time and the minimum word line program time (that is, "YES" at S1040), the state check time may be, for example, the sum of the basic state check time and the additional state check time. The additional state check time may be, for example, a value obtained by dividing the difference between the maximum word line program time and the minimum word line program time by the ratio of the current usage of the write buffer to the target usage of the write buffer.

In one embodiment, the state check time may be represented by Equation 1:

$$\begin{aligned}&\text{state check time}=\text{basic state check time}+[(\text{maximum}\\&\quad\text{word line program time}-\text{minimum word line}\\&\quad\text{program time})/(\text{current usage of write buffer}/\\&\quad\text{target usage of write buffer})]\end{aligned} \quad (1)$$

When the difference between the target program response time and the basic state check time is equal to or greater than the difference between the maximum word line program time and the minimum word line program time (that is, "NO" at S1040), the state check time may correspond to the sum of the basic state check time and the additional state check time. Also, the additional state check time may be a value obtained by dividing the difference between the target program response time and the basic state check time by the ratio of the current usage of the write buffer to the target usage of the write buffer.

In one embodiment, the state check time may be represented by Equation:

$$\begin{aligned}&\text{state check time}=\text{basic state check time}+[(\text{target program response time}-\text{basic state check time})/\\&\quad(\text{current usage of write buffer}/\text{target usage of}\\&\quad\text{write buffer})]\end{aligned} \quad (2)$$

Thus, when the difference between the target program response time and the basic state check time is less than the difference between the maximum word line program time and the minimum word line program time, the controller 130 may calculate the additional state check time based on the maximum word line program time and the minimum word line program time. When the difference between the target program response time and the basic state check time is equal to or greater than the difference between the maximum word line program time and the minimum word line program time, the controller 130 may calculate the additional state check time based on the difference between the target program response time and the basic state check time.

In addition, in one embodiment, the additional state check time may be proportional to the usage rate of the write buffer. As shown in Equations 1 and 2, when the current usage of the write buffer is less than the target usage of the write buffer, the additional state check time may increase to a greater level. In the case of Equation 1, when the current usage of the write buffer and the target usage of the write buffer are the same as each other, the additional state check time may be a value obtained by subtracting the minimum word line program time from the maximum word line program time. When the current usage of the write buffer is less than the target usage of the write buffer, the additional state check time may be greater than the value obtained by subtracting the minimum word line program time from the maximum word line program time. When the current usage of the write buffer is less than the target usage of the write buffer, this means that the programming is being performed more quickly on the memory device 150 and the response is also made more quickly than when the current usage of the write buffer and the target usage of the write buffer are the same as each other. Accordingly, when the current usage of the write buffer is less than the target usage of the write buffer, the additional state check time may increase to a greater level as compared to when the current usage of the write buffer and the target usage of the write buffer are the same as each other.

On the contrary, when the current usage of the write buffer is greater than the target usage of the write buffer, the additional state check time may be less than the value obtained by subtracting the minimum word line program time from the maximum word line program time. When the current usage of the write buffer is greater than the target usage of the write buffer, this may mean that the programming is being performed late on the memory device 150 and the response is delayed as compared to when the current usage of the write buffer and the target usage of the write buffer are the same as each other. Therefore, when the current usage of the write buffer is greater than the target usage of the write buffer, the additional state check time may be decreased as compared to when the current usage of the write buffer and the target usage of the write buffer are the same as each other. This may mean that the additional state check time does not need to be equal to or greater than the value obtained by subtracting the minimum word line program time from the maximum word line program time. This is because the current usage of the write buffer would be greater than the target usage of the write buffer and the response time would be delayed as much as the difference in usage.

Through Equation 2, the additional state check time may be calculated as in Equation 1. For example, when the current usage of the write buffer and the target usage of the write buffer are the same as each other, the additional state check time may be a value obtained by subtracting the basic state check time from the target program response time. When the current usage of the write buffer is less than the target usage of the write buffer, the additional state check time may be greater than the value obtained by subtracting the basic state check time from the target program response time. On the contrary, when the current usage of the write buffer is greater than the target usage of the write buffer, the additional state check time may be less than the value obtained by subtracting the basic state check time from the target program response time.

As described above, according to the present embodiment, the memory system 110 may keep the program response time constant even in performing a garbage collection state to prevent a difference between program response times from occurring and prevent the quality of service (QoS) from deteriorating.

Hereinbelow, detailed descriptions will be made with reference to FIGS. 10 to 18 for a data processing system and electronic appliances to which the memory system 110 including the memory device 150 and the controller 130 described above with reference to FIGS. 1 to 9, in accordance with the embodiment of the disclosure, is applied.

Figure 10:
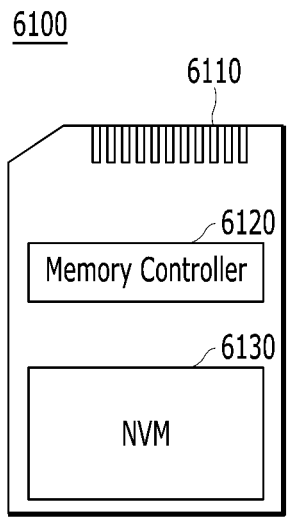
FIG. 10 illustrates an embodiment of a data processing system.

FIG. 10 is a diagram illustrating another embodiment of a data processing system including a memory system. For example, FIG. 10 illustrates an embodiment of a memory card system 6100 to which the memory system may be applied.

Referring to FIG. 10, the memory card system 6100 may include a memory controller 6120, a memory device 6130 and a connector 6110. The memory controller 6120 may be electrically connected to, and configured to access, the memory device 6130 embodied by a nonvolatile memory (NVM). For example, the memory controller 6120 may be configured to control read, write, erase and background operations of the memory device 6130. The memory controller 6120 may be configured to provide an interface between the memory device 6130 and a host, and to use firmware for controlling the memory device 6130. For example, the memory controller 6120 may correspond to the controller 130 of the memory system 110 described with reference to FIG. 1, and the memory device 6130 may correspond to the memory device 150 of the memory system 110 described with reference to FIG. 1.

Thus, the memory controller 6120 may include a random access memory (RAM), a processor, a host interface, a memory interface and an error correction component.

The memory controller 6120 may communicate with an external device, for example, the host 102 of FIG. 1, through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), advanced technology attachment (ATA), serial-ATA, parallel-ATA, small computer system interface (SCSI), enhanced small disk interface (EDSI), integrated drive electronics (IDE), Firewire, universal flash storage (UFS), wireless fidelity (Wi-Fi or WiFi), or Bluetooth. Thus, the memory system and the data processing system in accordance with the present embodiment may be applied to wired/wireless electronic devices or specific mobile electronic devices.

The memory device 6130 may be implemented by a nonvolatile memory (NVM). For example, the memory device 6130 may be implemented by any of various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM), or a spin torque transfer magnetic RAM (STT-RAM).

The memory controller 6120 and the memory device 6130 may be integrated into a single semiconductor device to form a solid-state drive (SSD). Also, the memory controller 6120 and the memory device 6130 may be so integrated to form a memory card. Examples include a PC card (personal computer memory card international association (PCMCIA)), a compact flash (CF) card, a smart media card (e.g., a SM and a SMC), a memory stick, a multimedia card (e.g., a MMC, a RS-MMC, a MMCmicro and an eMMC), a secure digital (SD) card (e.g., a SD, a miniSD, a microSD and a SDHC), and/or a universal flash storage (UFS).

Figure 11:
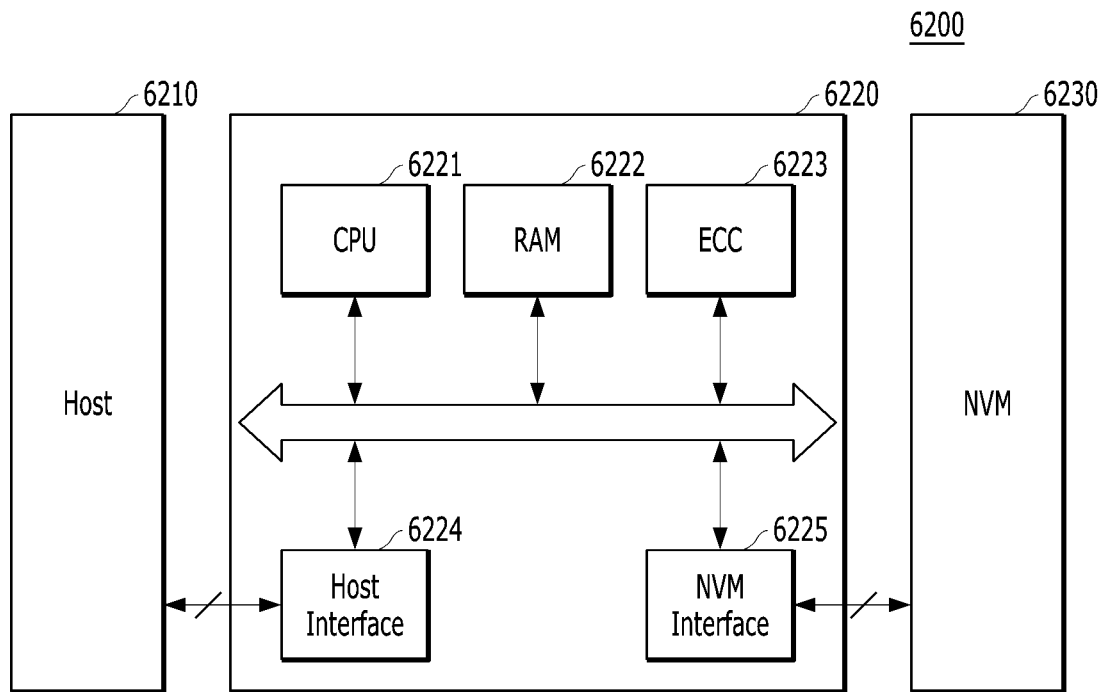
FIG. 11 illustrates an embodiment of a data processing system.

FIG. 11 is a diagram illustrating another embodiment of a data processing system 6200 including a memory system in accordance with an embodiment.

Referring to FIG. 11, the data processing system 6200 may include a memory device 6230 having one or more nonvolatile memories (NVMs) and a memory controller 6220 for controlling the memory device 6230. The data processing system 6200 of FIG. 11 may serve as a storage medium such as a memory card (e.g., CF, SD, micro-SD or the like) or USB device, as described with reference to FIG. 1. The memory device 6230 may correspond to the memory device 150 in the memory system 110 illustrated in FIG. 1 and the memory controller 6220 may correspond to the controller 130 in the memory system 110 illustrated in FIG. 1.

The memory controller 6220 may control a read, write or erase operation on the memory device 6230 in response to a request of the host 6210. The memory controller 6220 may include one or more central processing units (CPUs) 6221, a buffer memory such as a random access memory (RAM) 6222, an error correction code (ECC) circuit 6223, a host interface 6224, or a memory interface such as a nonvolatile memory (NVM) interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or vice versa. When the RAM 6222 is used as a cache memory, the RAM 6222 may assist the low-speed memory device 6230 to operate at high speed.

The ECC circuit 6223 may generate an error correction code (ECC) for correcting a failed bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data output from the memory device 6230. The ECC circuit 6223 may correct an error using the parity bit. The ECC circuit 6223 may correct an error based on the low density parity check (LDDC) code, Bose-Chaudhri-Hocquenghem (BCH) code, turbo code, Reed-Solomon (RS) code, convolution code, recursive systematic code (RSC) or coded modulation such as trellis coded modulation (TCM) or block coded modulation (BCM).

The memory controller 6220 may transmit/receive data to/from the host 6210 through the host interface 6224. The memory controller 6220 may transmit/receive data to/from the memory device 6230 through the NVM interface 6225. The host interface 6224 may be connected to the host 6210 through a parallel advanced technology attachment (PATH) bus, a serial advanced technology attachment (SATA) bus, a small computer system interface (SCSI), a universal serial bus (USB), a peripheral component interconnect-express (PCIe) or a NAND interface. The memory controller 6220 may perform a wireless communication function with a mobile communication protocol such as wireless fidelity (WiFi) or long term evolution (LTE). The memory controller 6220 may be connected to an external device (e.g., the host 6210 or another external device) and then transmit/receive data to/from the external device. For example, as the memory controller 6220 is configured to communicate with the external device according to one or more of various communication protocols, the memory system and the data processing system in accordance with an embodiment may be applied to wired/wireless electronic devices, particularly a mobile electronic device.

Figure 12:
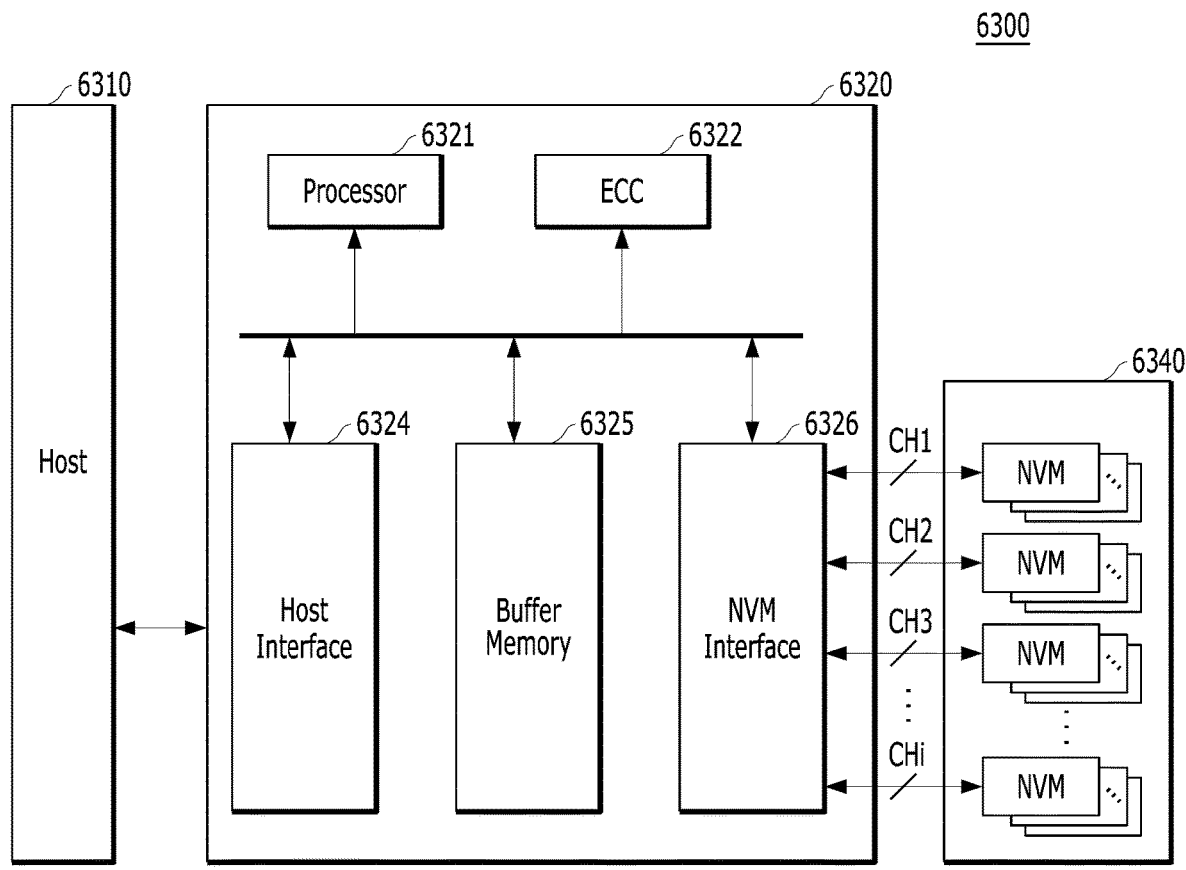
FIG. 12 illustrates an embodiment of a data processing system.

FIG. 12 is a diagram illustrating another embodiment of a data processing system including a memory system. For example, FIG. 12 illustrates an embodiment of a solid state drive (SSD) 6300 to which the memory system may be applied.

Referring to FIG. 12, the SSD 6300 may include a controller 6320 and a memory device 6340 including a plurality of nonvolatile memories (NVMs). The controller 6320 may correspond to the controller 130 in the memory system 110 of FIG. 1, and the memory device 6340 may correspond to the memory device 150 in the memory system of FIG. 1.

The controller 6320 may be connected to the memory device 6340 through a plurality of channels CH1 to CHi, and may include one or more processors 6321, an error correction code (ECC) circuit 6322, a host interface 6324, a buffer memory 6325 and a memory interface, for example, a nonvolatile memory interface 6326.

The buffer memory 6325 may temporarily store data provided from the host 6310 or data provided from a plurality of flash memories NVM included in the memory device 6340. Further, the buffer memory 6325 may temporarily store meta data of the plurality of flash memories NVM, for example, map data including a mapping table. The buffer memory 6325 may be embodied by any of a variety of volatile memories. Examples include a dynamic random access memory (DRAM), a synchronous DRAM (SDRAM), a double data rate (DDR) SDRAM, a low power DDR (LPDDR) SDRAM and a graphics RAM (GRAM) or nonvolatile memories such as a ferroelectric RAM (FRAM), a resistive RAM (RRAM or ReRAM), a spin-transfer torque magnetic RAM (STT-MRAM) and a phase-change RAM (PRAM). FIG. 12 illustrates that the buffer memory 6325 is embodied in the controller 6320. However, the buffer memory 6325 may be external to the controller 6320.

The ECC circuit 6322 may calculate an error correction code (ECC) value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may perform an interface function with an external device (e.g., host 6310) and the nonvolatile memory interface 6326 may perform an interface function with the memory device 6340 connected through the plurality of channels.

Furthermore, a plurality of SSDs 6300 to which the memory system 110 of FIG. 1 may be applied may be provided to embody a data processing system, for example, a redundant array of independent disks (RAID) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels (e.g., RAID level information of the write command provided from the host 6310 in the SSDs 6300), and may output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels (e.g., RAID level information of the read command provided from the host 6310 in the SSDs 6300), and may provide data read from the selected SSDs 6300 to the host 6310.

Figure 13:
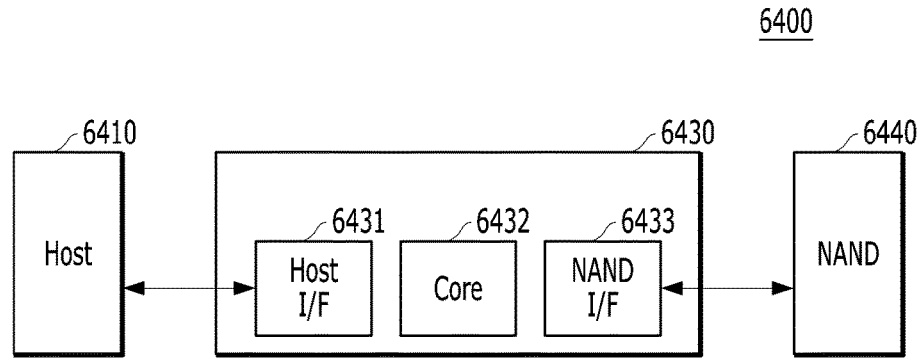
FIG. 13 illustrates an embodiment of a data processing system.

FIG. 13 is a diagram illustrating another embodiment of a data processing system including a memory system. For example, FIG. 13 illustrates an embodiment of an embedded multi-media card (eMMC) 6400 to which the memory system may be applied.

Referring to FIG. 13, the eMMC 6400 may include a controller 6430 and a memory device 6440 embodied by one or more NAND flash memories. The controller 6430 may correspond to the controller 130 in the memory system 110 of FIG. 1. The memory device 6440 may correspond to the memory device 150 in the memory system 110 of FIG. 1.

The controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may perform an interface function between the controller 6430 and the host 6410, and the NAND interface 6433 may perform an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, ultra high speed (UHS)-I/UHS-II) interface.

FIGS. 14 to 17 are diagrams illustrating other embodiments of a data processing system including a memory system. For example, FIGS. 14 to 17 illustrate universal flash storage (UFS) systems to which the memory system may be applied.

Referring to FIGS. 14 to 17, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices (e.g., mobile electronic devices), the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices such as mobile electronic devices through UFS protocols, and the UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 11 to 13, and the UFS cards 6530, 6630, 6730, 6830 may be embodied in the form of the memory card system 6100 described with reference to FIG. 10.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI unified protocol (UniPro) in mobile industry processor interface (MIPI). Furthermore, the UFS devices 6520, 6620, 6720, 6820 and the UFS cards 6530, 6630, 6730, 6830 may communicate with each other through any of various protocols other than the UFS protocol, for example, universal storage bus (USB) Flash Drives (UFDs), a multi-media card (MMC), a secure digital (SD), a mini-SD, and a micro-SD.

Figure 14:
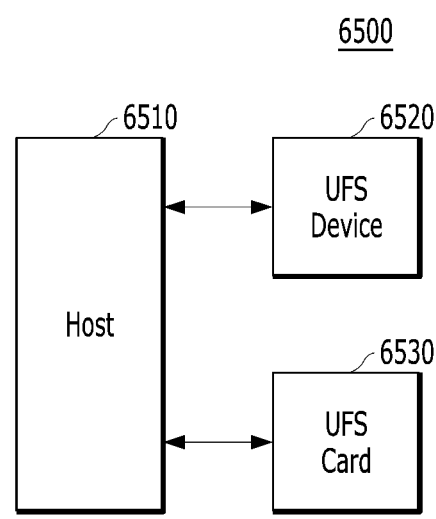
FIGS. 14 to 17 illustrate embodiments of data processing systems.

In the UFS system 6500 illustrated in FIG. 14, each of the host 6510, the UFS device 6520 and the UFS card 6530 may include UniPro. The host 6510 may perform a switching operation to communicate with the UFS device 6520 and the UFS card 6530. For example, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the illustrated embodiment, one UFS device 6520 and one UFS card 6530 are connected to the host 6510. However, a plurality of UFS devices and UFS cards may be connected in parallel or in the form of a star to the host 6410. A star formation may include an arrangement in which a single device is coupled with plural devices for centralized operation. A plurality of UFS cards may be connected in parallel or in the form of a star to the UFS device 6520, or connected in series or in the form of a chain to the UFS device 6520.

Figure 15:
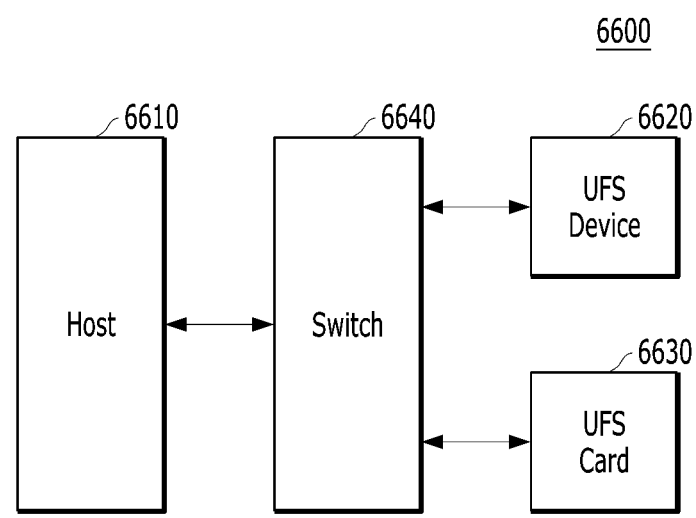

In the UFS system 6600 illustrated in FIG. 15, each of the host 6610, the UFS device 6620 and the UFS card 6630 may include UniPro. The host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the illustrated embodiment, one UFS device 6620 and one UFS card 6630 are connected to the switching module 6640. However, a plurality of UFS devices and UFS cards may be connected in parallel or in the form of a star to the switching module 6640. A plurality of UFS cards may be connected in series or in the form of a chain to the UFS device 6620.

Figure 16:
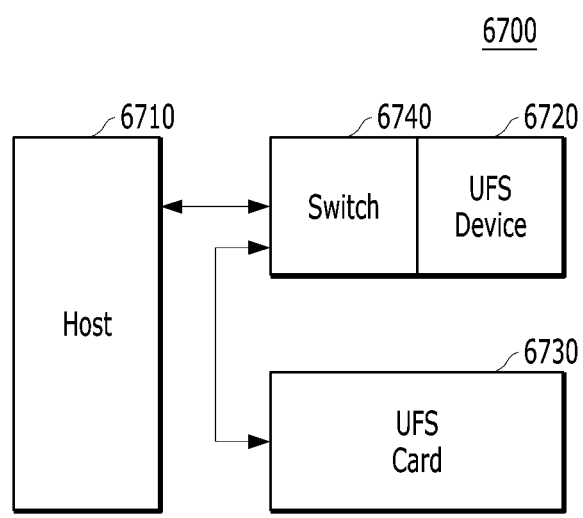

In the UFS system 6700 illustrated in FIG. 16, each of the host 6710, the UFS device 6720 and the UFS card 6730 may include UniPro. The host 6710 may communicate with the UFS device 6720 or the UFS card 6730 through a switching module 6740 performing a switching operation, for example, through the switching module 6740 which performs link layer switching at the UniPro, e.g., L3 switching. The UFS device 6720 and the UFS card 6730 may communicate with each other through link layer switching of the switching module 6740 at the UniPro. The switching module 6740 may be integrated as one module with the UFS device 6720 inside or outside the UFS device 6720.

In the illustrated embodiment, one UFS device 6720 and one UFS card 6730 are connected to the switching module 6740. However, a plurality of modules may be connected in parallel or in the form of a star to the host 6710, with each module including the switching module 6740 and the UFS device 6720. In another example, a plurality of modules may be connected in series or in the form of a chain to each other. Furthermore, a plurality of UFS cards may be connected in parallel or in the form of a star to the UFS device 6720.

Figure 17:
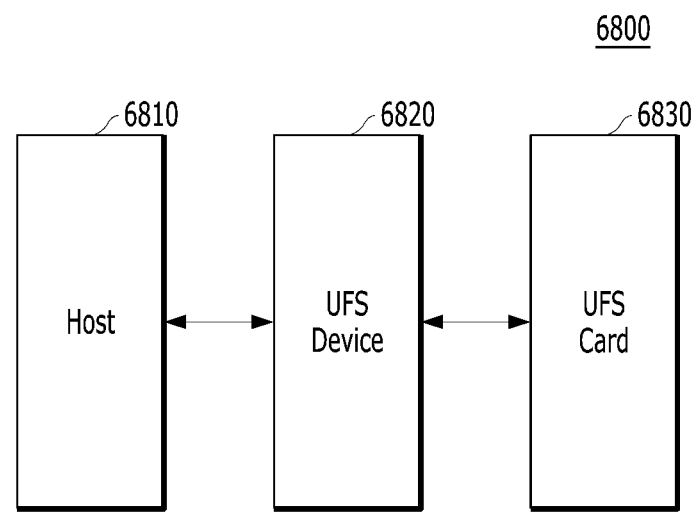

In the UFS system 6800 illustrated in FIG. 17, each of the host 6810, the UFS device 6820 and the UFS card 6830 may include M-PHY and UniPro. The UFS device 6820 may perform a switching operation to communicate with the host 6810 and the UFS card 6830. For example, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target identifier (ID) switching operation. The host 6810 and the UFS card 6830 may communicate with each other through target ID switching between the M-PHY and UniPro modules of the UFS device 6820.

In the illustrated embodiment, one UFS device 6820 is connected to the host 6810 and one UFS card 6830 is connected to the UFS device 6820. However, a plurality of UFS devices may be connected in parallel or in the form of a star to the host 6810, or connected in series or in the form of a chain to the host 6810. A plurality of UFS cards may be connected in parallel or in the form of a star to the UFS device 6820, or connected in series or in the form of a chain to the UFS device 6820.

Figure 18:
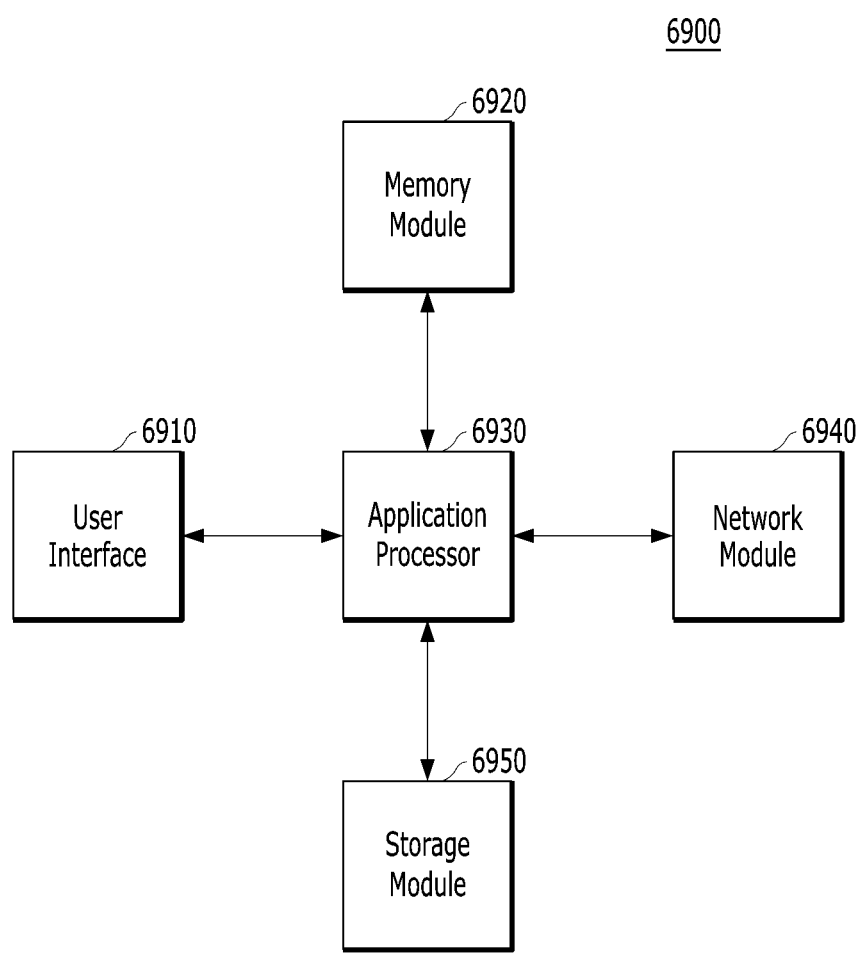
FIG. 18 illustrates an embodiment of a data processing system.

FIG. 18 is a diagram illustrating another embodiment of a data processing system including a memory system. For example, FIG. 18 is a diagram illustrating a user system 6900 to which the memory system may be applied.

Referring to FIG. 18, the user system 6900 may include a user interface 6910, a memory module 6920, an application processor 6930, a network module 6940 and a storage module 6950. The application processor 6930 may drive components in the user system 6900, for example, an operating system (OS), and include controllers, interfaces and a graphic engine which control the components included in the user system 6900. The application processor 6930 may be provided, for example, as System-on-Chip (SoC).

The memory module 6920 may be used as a main memory, work memory, buffer memory or cache memory of the user system 6900. The memory module 6920 may include a volatile random access memory (RAM). Examples include a dynamic RAM (DRAM), a synchronous DRAM (SDRAM), a double data rate (DDR) SDRAM, a DDR2 SDRAM, a DDR3 SDRAM, a low power DDR (LPDDR) SDARM, a LPDDR3 SDRAM or a LPDDR3 SDRAM or a nonvolatile RAM such as a phase-change RAM (PRAM), a resistive RAM (ReRAM), a magneto-resistive RAM (MRAM) or a ferroelectric RAM (FRAM). For example, the application processor 6930 and the memory module 6920 may be packaged and mounted, based on package on package (PoP).

The network module 6940 may communicate with external devices. For example, the network module 6940 may not only support wired communication, but also support various wireless communication protocols. Examples include code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), thereby communicating with wired/wireless electronic devices, particularly mobile electronic devices. Therefore, in accordance with an embodiment, the memory system and the data processing system can be applied to wired/wireless electronic devices. The network module 6940 may be included, for example, in the application processor 6930.

The storage module 6950 may store data, for example, data received from the application processor 6930, and then may transmit the stored data to the application processor 6930. The storage module 6950 may be embodied by a nonvolatile semiconductor memory device. Examples include a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, an eMMC and an UFS as described above with reference to FIGS. 12 to 17.

In accordance with one or more of the embodiments described herein, it is possible to provide a memory device, and an operating method of a memory system including the memory device, which may dynamically adjust state check start time of word lines of the memory device. Also, according to one or more embodiments, it is possible to provide a memory device, and an operating method of a memory system including the memory device, which may adjust state check start time of word lines of the memory device on the basis of the usage of a write buffer and maximum and minimum word line program times. Further, according to one or more embodiments, it is possible to provide a memory device, and an operating method of a memory system including the memory device, which may prevent the quality of service (QoS) from deteriorating by keeping program response time constant even in performing a garbage collection state. While the present disclosure has been described with respect to specific embodiments, it will be apparent to those skilled in the art that various changes and modifications may be made without departing from the spirit and scope of the disclosure as defined in the following claims. Therefore, the scope of the present disclosure should not be limited to the described embodiments, but be defined not only by the scope of the following claims but also by the equivalents of the claims. The embodiments may be combined to form additional embodiments.

What is claimed is:

1. A memory system, comprising:
   a memory device including at least one word line and at least one memory cell coupled to the word line; and
   a controller including a write buffer configured to store a program command and data received from a host, the controller suitable for controlling a program operation of storing the data in the memory cell coupled to the word line based on the program command, setting state check time of the word line during a performance period of the program operation, and checking a state of the word line according to a timeout signal generated based on the set state check time,
   wherein the controller sets the state check time based on a sum of a basic state check time, which is determined based on the memory cell, and an additional state check time which is determined based on a target program response time, a maximum program time and a minimum program time of the word line.

2. The memory system of claim 1, wherein the controller includes:
   a state check time setting logic suitable for setting the state check time of the word line;
   a timeout generator suitable for generating the timeout signal based on the state check time set by the state check time setting unit; and
   a state check performing logic suitable for checking the state of the word line according to the timeout signal.

3. The memory system of claim 2, wherein:
the state check time setting unit is configured to check whether the memory device is in a garbage collection state, and
when the memory device is in the garbage collection state, the state check time setting unit is configured to check whether the write buffer is in a saturation state.

4. The memory system of claim 3, wherein the state check time setting logic is configured to compare target program response time with the basic state check time when the write buffer is not in the saturation state.

5. The memory system of claim 4, wherein the state check time setting logic is configured to compare a difference between the target program response time and the basic state check time with a difference between maximum word line program time and minimum word line program time, when the target program response time is greater than the basic state check time.

6. The memory system of claim 5, wherein the state check time setting logic sets the state check time based on the basic state check time and the additional state check time.

7. The memory system of claim 6, wherein the additional state check time is calculated based on the difference between the maximum word line program time and the minimum word line program time, when the difference between the target program response time and the basic state check time is less than the difference between the maximum word line program time and the minimum word line program time.

8. The memory system of claim 6, wherein the additional state check time is calculated based on the difference between the maximum word line program time and the minimum word line program time and a ratio of target usage of the write buffer to actual usage of the write buffer, when the difference between the target program response time and the basic state check time is less than the difference between the maximum word line program time and the minimum word line program time.

9. The memory system of claim 6, wherein the additional state check time is calculated based on the difference between the target program response time and the basic state check time, when the difference between the target program response time and the basic state check time is equal to or greater than the difference between the maximum word line program time and the minimum word line program time.

10. The memory system of claim 6, wherein the additional state check time is calculated based on the difference between the target program response time and the basic state check time and a ratio of target usage of the write buffer to actual usage of the write buffer, when the difference between the target program response time and the basic state check time is equal to or greater than the difference between the maximum word line program time and the minimum word line program time.

11. A method of operating a memory system, comprising:
performing a program operation on at least one memory cell coupled to at least one word line;
setting state check time for the word line during a performance period of the program operation;
generating a timeout signal based on the state check time; and
checking a state of the word line according to the timeout signal,
wherein the state check time is set based on a sum of a basic state check time, which is determined based on the memory cell, and an additional state check time which is determined based on a target program response time, a maximum program time and a minimum program time of the word line.

12. The method of claim 11, further comprising:
checking whether a memory device is in a garbage collection state.

13. The method of claim 12, further comprising:
checking whether a write buffer is in a saturation state when the memory device is in performing the garbage collection state.

14. The method of claim 13, further comprising:
comparing target program response time with the basic state check time when the write buffer is not in the saturation state.

15. The method of claim 14, further comprising:
comparing a difference between the target program response time and the basic state check time with a difference between maximum word line program time and minimum word line program time, when the target program response time is greater than the basic state check time.

16. The method of claim 15, further comprising:
setting the state check time based on the basic state check time and the additional state check time.

17. The method of claim 16, wherein the additional state check time is calculated based on the difference between the maximum word line program time and the minimum word line program time, when the difference between the target program response time and the basic state check time is less than the difference between the maximum word line program time and the minimum word line program time.

18. The method of claim 16, wherein the additional state check time is calculated based on the difference between the maximum word line program time and the minimum word line program time and a ratio of target usage of the write buffer to actual usage of the write buffer, when the difference between the target program response time and the basic TT state check time is less than the difference between the maximum word line program time and the minimum word line program time.

19. The method of claim 16, wherein the additional state check time is calculated based on the difference between the target program response time and the basic state check time, when the difference between the target program response time and the basic state check time is equal to or greater than the difference between the maximum word line program time and the minimum word line program time.

20. The method of claim 16, wherein the additional state check time is calculated based on the difference between the target program response time and the basic state check time and a ratio of target usage of the write buffer to actual usage of the write buffer, when the difference between the target program response time and the basic state check time is equal to or greater than the difference between the maximum word line program time and the minimum word line program time.

21. A memory system comprising:
a memory device including at least one memory cell coupled to at least one word line; and
a controller configured to:
perform a program operation on the memory cell;
determine a state check time for the word line;
generate a timeout signal based on the state check time; and
transmit, to the memory device, a state check command in response to the timeout signal such that the memory device checks a busy or ready state of the word line associated with the program operation on the memory cell and notifies the controller of the state of the word line, wherein the state check time is determined based on a sum of a basic state check time and an additional state check time, wherein the basic state check time is determined based on the memory cell, and wherein the additional state check time is determined based on a target program response time, a maximum program time and a minimum program time of the word line.

* * * * *